US009156089B2

(12) United States Patent
Billieres

(10) Patent No.: US 9,156,089 B2
(45) Date of Patent: Oct. 13, 2015

(54) PROCESS FOR PRODUCING A TARGET BY THERMAL SPRAYING

(75) Inventor: Dominique Billieres, Saint-Saturnin les Avignon (FR)

(73) Assignee: SAINT-GOBAIN COATING SOLUTIONS, Avignon (FR)

( * ) Notice: Subject to any disclaimer, the term of this patent is extended or adjusted under 35 U.S.C. 154(b) by 48 days.

(21) Appl. No.: 13/259,991

(22) PCT Filed: Apr. 12, 2010

(86) PCT No.: PCT/FR2010/050704
§ 371 (c)(1),
(2), (4) Date: Nov. 22, 2011

(87) PCT Pub. No.: WO2010/116112
PCT Pub. Date: Oct. 14, 2010

(65) Prior Publication Data
US 2012/0055783 A1 Mar. 8, 2012

(30) Foreign Application Priority Data
Apr. 10, 2009 (FR) ..................... 09 52394

(51) Int. Cl.
*H01J 37/34* (2006.01)
*B22F 7/08* (2006.01)
(Continued)

(52) U.S. Cl.
CPC . *B22F 7/08* (2013.01); *B22F 3/115* (2013.01); *C23C 4/08* (2013.01); *C23C 4/105* (2013.01); *C23C 4/127* (2013.01); *C23C 4/128* (2013.01); *C23C 14/3414* (2013.01); *H01J 37/3429* (2013.01); *H01J 37/3491* (2013.01);
(Continued)

(58) Field of Classification Search
CPC .................................................. H01J 37/3491
See application file for complete search history.

(56) References Cited

U.S. PATENT DOCUMENTS 6,056,857 A * 5/2000 Hunt et al. ............... 204/192.15
6,740,624 B1   5/2004 Hoste et al.
(Continued)

FOREIGN PATENT DOCUMENTS

EP   0 479 678   4/1992
EP   1 090 158   2/2006
(Continued)

OTHER PUBLICATIONS

Murakami, K., et al., "Rapidly Solidified Thick Deposit Layers of Fe—C—Mo Alloys by Flame Spraying," Materials Science and Engineering A: Structural Materials: Properties, Microstructure & Processing, Lausanne, CH, vol. A117, pp. 227-233, (Jan. 1, 1989) XP002082154.

(Continued)

*Primary Examiner* — Keith Hendricks
*Assistant Examiner* — Timon Wanga
(74) *Attorney, Agent, or Firm* — Oblon, McClelland, Maier & Neustadt, L.L.P.

(57) ABSTRACT

Process for producing a target by thermal spraying, especially by plasma spraying, said target comprising at least one compound chosen from refractory metals, resistive oxides and volatile oxides, characterized in that at least one fraction of said compound in the form of a powder composition of said compound is sprayed by thermal spraying, onto at least one surface portion of the target, in a controlled atmosphere and in that powerful cryogenic cooling jets directed onto the target during its construction are used.

22 Claims, 4 Drawing Sheets

(51) Int. Cl.
  *B22F 3/115*   (2006.01)
  *C23C 4/08*    (2006.01)
  *C23C 4/10*    (2006.01)
  *C23C 4/12*    (2006.01)
  *C23C 14/34*   (2006.01)
  *H01L 31/0224* (2006.01)

(52) U.S. Cl.
  CPC ..... *H01L31/022425* (2013.01); *B22F 2998/00* (2013.01); *B22F 2999/00* (2013.01); *Y02E 10/50* (2013.01); *Y02T 50/67* (2013.01)

(56) References Cited

U.S. PATENT DOCUMENTS

| | | | | |
|---|---|---|---|---|
| 2005/0084654 | A1* | 4/2005 | Takahashi et al. | 428/143 |
| 2006/0184251 | A1* | 8/2006 | Zhang et al. | 623/23.56 |
| 2006/0228465 | A1 | 10/2006 | Zurecki | |
| 2006/0233965 | A1 | 10/2006 | Boulos et al. | |
| 2007/0072432 | A1* | 3/2007 | Yoon et al. | 438/707 |
| 2007/0117237 | A1 | 5/2007 | Inoue | |
| 2008/0083708 | A1* | 4/2008 | Hussary et al. | 219/121.5 |
| 2008/0138620 | A1* | 6/2008 | Nadaud et al. | 428/402 |
| 2008/0271779 | A1* | 11/2008 | Miller et al. | 136/252 |
| 2008/0289958 | A1* | 11/2008 | Kardokus et al. | 204/298.12 |

FOREIGN PATENT DOCUMENTS

| | | |
|---|---|---|
| EP | 1 626 416 | 2/2006 |
| EP | 1 712 962 | 10/2006 |

OTHER PUBLICATIONS

Mueller, M., et al., "Radio Frequency Plasma Processing to Produce Chromium Sputter Targets," Journal of Thermal Spray Technology, vol. 9, No. 4, pp. 488-493, (Dec. 1, 2000) XP008114705.

International Search Report Issued Dec. 28, 2010 in PCT/FR10/050704 Filed Apr. 12, 2010.

French Search Report Issued Nov. 18, 2009 in FR0952394 filed Apr. 10, 2009.

* cited by examiner

Figure 1d
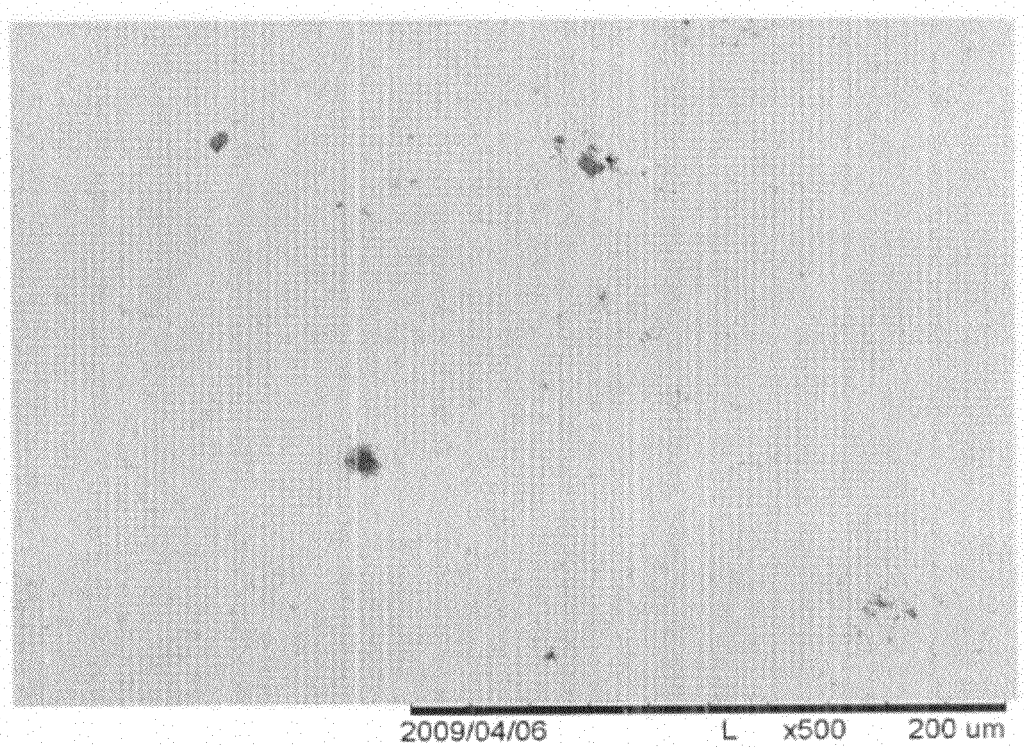
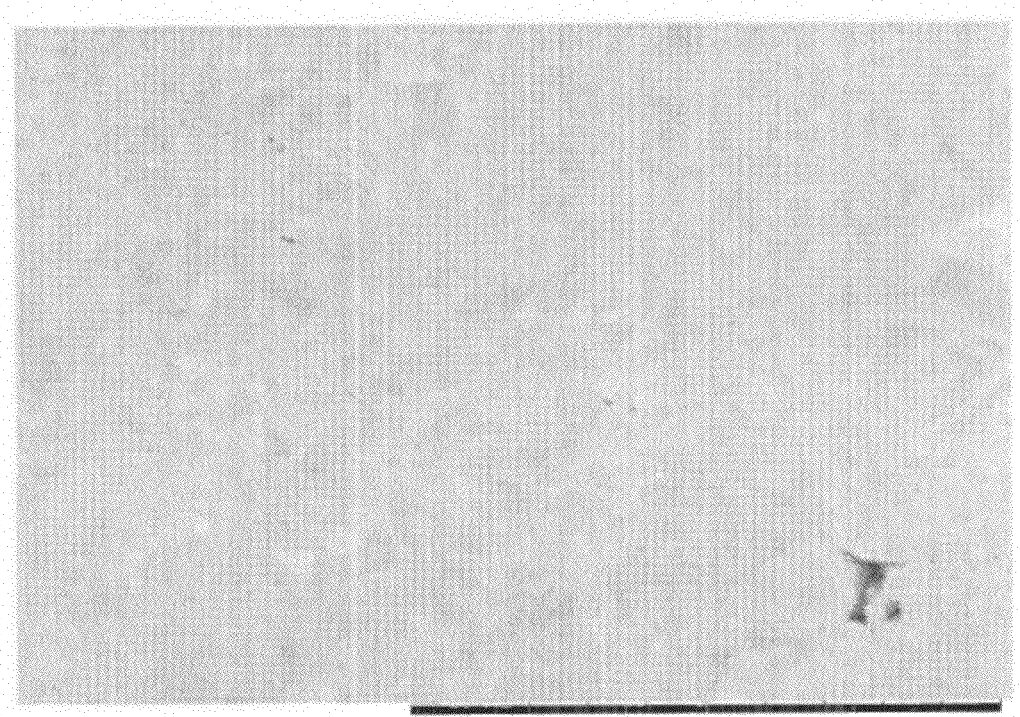
Figure 1e

PROCESS FOR PRODUCING A TARGET BY THERMAL SPRAYING

This application is a National Stage of PCT/FR10/050704 filed Apr. 12, 2010 and claims the benefit of FR 0952394 filed Apr. 10, 2009.

The present invention relates to a process for producing a target intended to be used in deposition processes carried out in a vacuum or in an inert or reactive atmosphere, especially by magnetron sputtering or by ion beam sputtering.

According to another aspect of the invention, it also relates to a target that can be possibly obtained by implementing said process and to the use of such a target for the purpose of obtaining films based on the material sputtered from said target, and also to a composition of the compound for producing said target by the process according to the invention.

Various techniques for manufacturing targets, including certain powder forming techniques, are known. Thus, the targets in question may result from a casting process (in the case of metal targets) or a powder sintering process followed by forming operations (in the case of metal targets), often hot shaping, and then assembly on a support, or direct assembly of sintered segments, or less conventionally a technique of thermal spraying and more particularly a plasma spraying technique.

These targets are intended to be used in processes commonly employed on an industrial scale for thin film deposition, especially on a glass substrate, such as for example the magnetron sputtering process. In this process, a plasma is created in a high vacuum close to a target comprising the chemical elements to be deposited. The active species of the plasma, by bombarding the target, tear off said elements, which are deposited on the substrate, forming the desired thin film.

In the specific case of a target intended for depositing molybdenum, a non-reactive deposition process is used in which the plasma is composed only of a sputtering gas, preferably a noble gas of the Ar, Kr, Xe or Ne type. This process is implemented for large substrates and enables thin films to be deposited on substrates, for example flat glass sheets with sides of more than 6 m in length.

These targets have a planar geometry or a tubular geometry.

Planar targets have the advantage of being able to be integrated in cathodes of relatively simple architecture compared with cathodes dedicated to rotary targets, which are much more complex. However, planar targets have a utilization factor which is generally 50% or less, which is not the case in rotary targets that have a utilization factor substantially greater than 50%.

In the specific case of thin films made of a refractory metal such as, for example, tungsten or molybdenum, molybdenum being a particularly expensive metal, it is preferred to use rotary targets of cylindrical geometry, as described in the patent U.S. Pat. No. 4,356,073 since these targets have a material yield (representing the proportion of sputtered material relative to the amount of material available on the target for producing a thin film) of greater than 70%, preferably greater than 75%. However, various other magnetron target geometries are known: planar (disk, square, rectangular) geometries and the invention is also applicable to geometries other than cylindrical ones.

Furthermore, there are also other vacuum processes for depositing molybdenum other than magnetron sputtering using a target: these include laser sputtering (laser ablation using a pulsed or continuous laser) and ion beam sputtering for example. These processes may also benefit from the use of a target according to the invention.

As regards more particularly molybdenum magnetron targets or those made of other refractory materials, many inventions have been filed relating to the following processes and forming the subject matter of the patent applications listed below:

Patent applications EP 1 784 518, US 2008/0193798 and WO 2006/041730.

Pressing then sintering of an ingot or a preform (under a pressure of 200 to 250 MPa and at a temperature of 1780 to 2175° C.) followed by hot forming (at about 900° C.) of this preform by rolling or extrusion or forging. Generally, this process also includes a heat treatment in hydrogen or a reducing atmosphere in order to reduce the oxide content in the target and optionally a stress relaxation annealing treatment.

Also known, from patent application WO 2006/117145, is the complete or partial construction, or restoration, of targets by cold spraying, which consists in spraying a gas/powder mixture at supersonic velocity, the powder not being in the molten state, thereby differing from the thermal spraying processes.

In the specific case of thin films based on a resistive oxide, these films are generally obtained by the reactive magnetron sputtering of metal targets and by oxidizing the material in situ by the partial pressure of oxygen injected into the deposition chamber or the RF sputtering of a metal or ceramic target.

The DC (direct current) magnetron sputtering process assumes that the material of the target allows the electric charges on its surface to be removed. This usually excludes ceramic targets of resistive compositions.

The invention makes it possible to produce magnetron targets based on oxides, i.e. resistive materials, with the advantage of greatly reducing their resistivity by introducing oxygen vacancies so as to allow the use of the target in nonreactive DC sputtering mode.

Nonreactive DC sputtering then becomes possible and has the following advantages:
  the process is more stable (no oxygen pressure hysteresis, no instability due to the formation of a resistive film on the surface of the initially conducting target, no source of parasitic arcs);
  higher sputtering rates (typically increased by a factor of 1.3 to 3 depending on the case) are possible in nonreactive DC magnetron mode.

Such targets can be produced, for certain compositions, by sintering in a reducing atmosphere. The invention makes it possible to produce such targets with in addition the advantages associated with plasma spraying, namely:
  possibility of producing large monolithic cylindrical targets;
  possibility of producing local extra thickness on the ends of these targets ("dog-bone" targets); and
  excellent bonding of the support tube without a meltable intermediate phase, thereby enabling the targets to be used at much higher power levels, and therefore to deposit thin films at higher rates.

In the specific case of resistive-oxide-based thin films, these are generally obtained by sputtering targets produced by a sintering process. The sintered monolithic part is then intended to be brazed onto a target support in the case of small targets, or by sintering segments or tiles which will then be juxtaposed during the operation of bonding the target support in the case of large targets (therefore resulting in targets with joints).

The thermal spraying (especially plasma spraying) technique used for the AZO (the reader may refer to JP 701433 and/or JP 7026373 and/or US 2007/0137999 for fabricating ITO-based materials) has, in the case of these materials, the handicap of having low material yields due to the fact that the vaporization of the sprayed material immediately results in material losses.

The process according to the invention makes it possible:
to minimize these losses and to make the process viable for such compositions;
to reduce the internal stresses in the targets produced by the process in question, without needing to increase the porosity, thereby enabling targets to be constructed that have greater thicknesses than those of the prior art using plasma spraying (for example a thickness of 6 mm in the case of AZO).

The present invention relates to a process for producing a target based on a compound chosen especially from refractory metals or resistive oxides or volatile oxides, by plasma spraying, with an operating performance at least equivalent, or even superior, to that obtained by conventional manufacturing processes.

In the context of the invention, the term "resistive oxides" is understood to mean the family of oxides with a volume resistivity greater than $10^5$ $\Omega$·cm at 25° C., among which oxides the following families may be mentioned:

a) Oxides with a Perovskite Structure of Formula $ABO_3$:
in which A and B are elements or combinations of elements such that the sum of the valencies of the element(s) constituting A and of the valency of the element(s) constituting B is equal to 6. The following families of elements constituting A and B may be listed:
  valency of 1 (K, Rb, etc.) combined with an element of valency 5 (Nb, Ta, V, etc.)
  valency of 2 (Sr, Ba, Pb, etc.) combined with an element of valency 4 (Ti, Zr, Hf, Sn, Ge, Ce, etc.)
  valency of 3 (La, Y, Sc, Bi, etc.).

As an example, the following oxides may be found in this family:
  titanates such as $BaTiO_3$, $SrTiO_3$ and $Pb(Zr_{53}Ti_{47})O_3$. $BaTiO_3$ has a volume resistivity of around $10^9$ $\Omega$·cm at room temperature;
  niobates such as PMN ($Pb(Mg_{1/3}Nb_{2/3})O_3$);

b) Oxides with a Columbite/Trirutile Structure of $AB_2O_6$ Type:
in which B is Nb or Ta and A is an element of valency 2 (Sr, Ba, Pb, etc.) or an assortment of these elements.

To give an example, the niobate SBN (Sr, Ba)$NbO_6$ may be mentioned.

c) Refractory nd Resistive Oxides:
other oxides such as $Ta_2O_5$, $Nb_2O_5$, $V_2O_5$, $ZrO_2$, $HfO_2$, $CeO_2$, $Y_2O_3$, $Al_2O_3$, $La_2O_3$, MgO, BeO, etc., also have a high volume resistivity at room temperature, greater than $10^5$ $\Omega$·cm at 25° C.

Mixed compounds of these oxides are also of interest, such as:
  ($Ta_2O_5$—$Nb_2O_5$) solid solutions;
  ($Al_2O_3$—$Y_2O_3$) compounds, for example YAG, $LaAlO_3$ (lanthanum aluminate), etc.;
  compounds of $D_xT_yO_z$ type in which D=Zr, Hf, Ce, Ti and where T=Al, Y, La, for example lanthanum titanate ($LaTiO_x$); and
  $D_xT_yV_vO_z$ compounds in which D=Zr, Hf, Ce, where T=Al, Y and where V=Ta, Nb, or V, for example (ZrAl-Nb)$O_x$.

In the context of the invention, the term "volatile oxides" is understood to mean the family of oxides for which the vaporization onset temperature $T_{vap}$ and the melting point $T_m$ satisfy the following criterion:

$$T_{vap} < T_m + 400° C.$$

Among these oxides, the following pure oxides, with their melting points (taken from the literature) and vaporization onset temperatures (taken from the literature or determined by TGA, i.e. thermogravimetric analysis), may be mentioned:

| Oxides | $T_m$ (° C.) | $T_{vap}$ (° C.) |
|---|---|---|
| ZnO | 1975 | ≈1430 |
| $SnO_2$ | 1630 | ≈1800-1900 |
| BaO | 1918 | ≈2000 |
| CdO | 1500 | ≈1000 |
| $In_2O_3$ | 1910 | ≈850 |
| $MoO_3$ | 795 | ≈1155 |
| Compounds | | |
| ITO | 1900 | ≈2000 |
| etc. | etc. | etc. |

Mention may also be made of the following compounds derived from pure oxides, namely:
  AZO (aluminum-doped zinc oxide);
  MZO (molybdenum zinc oxide);
  GZO (gallium-doped zinc oxide);
  ATO (antimony tin oxide); and
  FTO (fluorine-doped tin oxide); and mixtures of these oxides, such as for example mixed tin zinc oxide.

In the context of the invention, the term "refractory metals" is understood to mean metals chosen from the following list of refractory metals: tungsten, tantalum, niobium, titanium, vanadium, hafnium, zirconium, rhenium, rhodium and refractory alloys defined in that they consist of an AB alloy in which: A and B belong to the following list of elements: Mo, W, Ta, Nb, Ti, V, Hf, Zr, Re, Rh
and to alloys of the AM type in which:
A belongs to the list: Mo, W, Ta, Nb, Ti, V, Hf, Zr, Re; and
M belongs to the list: Co, Ni, Rh, Pd, Pt, Cu, Ag, Au.

For this purpose, the process according to the invention for producing a target by thermal spraying, especially by plasma spraying by means of a plasma torch, said target comprising at least one compound chosen from refractory metals or resistive oxides or volatile oxides, is characterized in that at least one fraction of said compound in the form of a powder composition of said compound is sprayed by thermal spraying, onto at least one surface portion of the target, in a controlled atmosphere and in that powerful, optionally cryogenic, cooling jets directed onto the target during its construction and distributed around the torch are used.

It will be recalled that fluids with a temperature equal to or below −150° C. are considered by definition to be cryogenic fluids.

The use during plasma spraying of cryogenic cooling jets (cryogenic liquid jets or mixed cryogenic gas/liquid jets or cryogenic gas jets) enables the quality of the target to be improved, while providing three functions:
  immediate cooling of the sprayed zone, thereby precluding any possibility of chemical modification, in the case of refractory compounds and resistive oxides, of the sprayed material;
  powerful cleaning of the sprayed surface so as to provide excellent clean cohesion between the particles and successive passes; and reduction in internal stresses, while increasing the material yield.

Moreover, the use of a plasma torch and a plasma gas mixture make it possible to obtain strong reduction in flight of the sprayed powder particles, thus reducing the oxygen content present in the target compared with that present in the powder ($T_{oc}<T_{op}$ where $T_{oc}$ is the oxygen content present in the target and $T_{op}$ is the oxygen content present in the powder), for the refractory compounds or the resistive compounds.

Furthermore, the process according to the invention includes the following, more conventional, aspects:

- a relative movement between the plasma torch and the target is established;
- the surface of the target is prepared prior to deposition of said compound;
- the surface preparation includes a step of blasting it with a jet of abrasive particles (called sandblasting) on the surface portion of the target in question, or alternatively a step of machining striations suitable for the keying of the sublayer; and
- the surface preparation then includes the spraying of a film of a keying material (sublayer) on the surface portion of the target in question.

In other embodiments of the invention, one or more of the following arrangements may optionally be employed:

- the refractory or resistive compound is sprayed in a chamber that has been purged or rinsed and then filled with an inert gas, at a pressure that may range from 50 mbar to 1100 mbar, so as to create an oxygen-depleted atmosphere within it;
- all or some of the cooling jets have an oxidizing character;
- a keying sublayer is used, this being deposited, before thermal spraying of said compound, on the surface portion of the target in question;
- the target is thermally regulated during the plasma spraying;
- a powder composition of said sprayed compound comprising powder particles with a size distribution given by $5<D_{10}<50\,\mu m$; $25\,\mu m<D_{50}<100\,\mu m$; and $40\,\mu m<D_{90}<200\,\mu m$ is used;
- it includes a subsequent heat treatment step in a reducing atmosphere for the purpose of reducing the oxygen content present in the target after the thermal spraying step; and
- several compound injectors are used for injecting, at different points in the thermal jet, different materials for which the injection parameters are adjusted independently according to the materials injected into each injector.

Another aspect of the invention relates to a target that can be optionally produced by the process according to the invention and intended to be used in a sputtering device, especially a magnetron sputtering device, or in any other vacuum sputtering device using a target, said target predominantly comprising a compound chosen from refractory metals, resistive oxides and volatile oxides.

For this purpose, the target according to the invention, of nominal thickness (e), comprising at least one compound based on a compound chosen from refractory metals, resistive metal oxides and volatile oxides, is characterized in that it has:

- a lamellar microstructure.

In the case of refractory metals, the target has:

- an oxygen content of less than 1000 ppm, preferably less than 600 ppm, and even more preferably less than 450 ppm; and
- an electrical resistivity less than five times, preferably three times and more preferably twice the theoretical electrical resistivity of the compound.

This resistivity measurement is carried out using the Van der Pauw (ASTM F76) method, the relative resistivity measurement being calculated relative to the theoretical value at 20° C. of the massive compound (or the value obtained from the literature) (as a reminder, molybdenum has a theoretical value of 5.34 μohms·cm).

In the case of compounds of resistive oxides, the target has a volume resistivity lower than the nominal resistivity of the oxide by a factor of 1000, preferably a factor of 10000 and even more preferably a factor of 100000.

In the case of compounds of volatile oxides, the target has:

- a nominal thickness greater than 3 mm, preferably greater than 6 mm; and
- a density greater than 85%, preferably greater than 90% of the nominal density.

In preferred embodiments of the invention, one or more of the following arrangements may optionally furthermore be employed:

- the resistive oxide forming the target is chosen from at least one of the oxides with a perovskite structure of formula $ABO_3$ in which A and B are elements or combinations of elements such that the sum of the valencies of the element(s) constituting A and of the valency of the element(s) constituting B is equal to 6, or chosen from oxides having a columbite/trirutile structure of the $AB_2O_6$ type in which B is Nb or Ta and A is an element of valency 2, for example Sr, Ba, Pb, etc., or is chosen from the list: $Ta_2O_5$, $Nb_2O_5$, $V_2O_5$, $ZrO_2$, $HfO_2$, $CeO_2$, $Y_2O_3$, $Al_2O_3$, $La_2O_3$, MgO, BeO;
- the resistive-oxide-based target comprises a composition consisting of a mixture or combination of two or more resistive oxides from the list above or comprises predominantly one resistive oxide;
- the refractory metal forming the target is chosen from tungsten, tantalum, niobium, titanium, vanadium, hafnium, zirconium, rhenium, rhodium and refractory alloys that are defined in that they consist of an AB alloy where A and B belong to the following list of elements: Mo, W, Ta, Nb, Ti, V, Hf, Zr, Re, Rh and to alloys of the AM type in which A belongs to the list: Mo, W, Ta, Nb, Ti, V, Hf, Zr, Re and M belongs to the list: Co, Ni, Rh, Pd, Pt, Cu, Ag, Au;
- the refractory metal target also includes at least one addition element chosen from a refractory compound, a volatile oxide compound or a resistive oxide compound, the target having 0.5 to 30% by weight of the addition element or addition elements; and
- the volatile oxide forming the target satisfies the criterion: $T_{vap}<T_m+400°$ C. as defined above, it being possible for this oxide to be especially zinc oxide, tin oxide, barium oxide, cadmium oxide indium oxide, molybdenum oxide, zinc oxide doped with aluminum, molybdenum, gallium, tin, fluorine or indium, or a mixed indium tin oxide, the volatile-oxide-based target comprising a composition consisting of a mixture or combination of two or more volatile oxides satisfying the above criterion or comprising predominantly one volatile oxide as defined above.

As a variant, the target may be composed of a refractory metal chosen from molybdenum, tungsten, tantalum, niobium, titanium, vanadium, hafnium, zirconium, rhenium, rhodium, on the one hand, and silicon, on the other, in molar proportions that may range from 1 mole of refractory metal per 5 moles of silicon up to 5 moles of refractory metal per 1 mole of silicon, preferably 1 mole of refractory metal per 2 moles of silicon. In this case, the lamellar microstructure of the target is composite and comprises refractory metal lamellae juxtaposed with pure silicon lamellae.

In the case in which the target includes an addition element or comprises an assembly of several materials, the various elements may be provided by one of the following means:
- use of a prealloyed powder in which each powder particle has the desired composition of the target, possibly slightly different in order to take into account any unequal losses by volatilization during the thermal spraying of the powder;
- use of two or more powders, each being injected by a different channel into the thermal jet during the thermal spraying step;
- the target has a planar geometry;
- the target has a tubular geometry;
- the target has additional thicknesses of material at each of its ends;
- the target comprises one or more parts on which the compound is deposited, said part(s) is (are) either a planar support that can be fitted onto a sputtering machine or intermediate parts that are then bonded onto this support;
- the additional thicknesses are around 25 to 50% of the nominal thickness of the compound layer;
- the target has a density of greater than 85%, preferably greater than 90%;
- the nominal thickness (e) is between 1 and 25 mm, preferably between 6 and 14 mm;
- the target has a purity of at least 99.5%; and
- the target is constructed on a support material providing characteristics compatible with the expected properties of a magnetron target in use (sufficient mechanical strength, sufficient thermal conductivity, resistance to corrosion by the water for cooling the target during use, etc.), such as for example copper or a copper alloy, or austenitic stainless steel, such as for example X2CrNi18-9 or X2CrNiMo17-12-2.

As nonlimiting examples, the invention may be illustrated by the following figures:

FIGS. 1d and 1e are views illustrating the microstructure in cross section of a tungsten target obtained by the production process according to the invention;

Figure 1A:
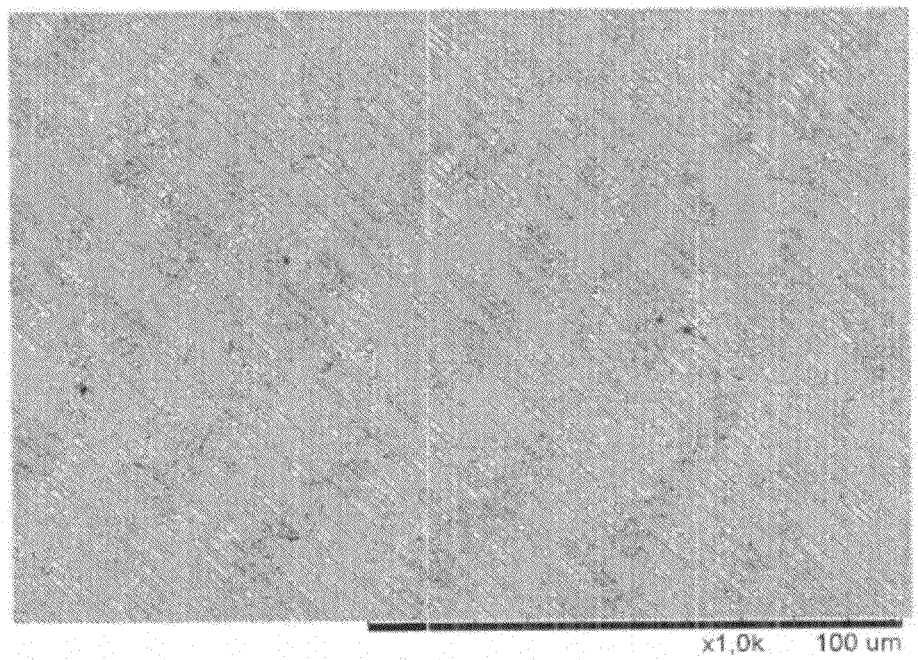
FIGS. 1a, 1b and 1c are views showing the microstructure in cross section of an Mo target obtained by the production process according to the invention.

Other features and advantages of the invention will become apparent over the course of the following description.

DETAILED DESCRIPTION OF THE INVENTION

The support on which the target is constructed may be made of copper, a copper alloy, stainless steel or any other alloy suitably compatible with the production of magnetron targets. In the present invention, no particular requirement associated with the process described in the invention is required that relates to the support such that it has to meet the usual requirements relating to magnetron targets, in terms of geometry, mechanical strength and chemical inertness with respect to the cooling water.

Surface Preparation of the Support

After having been degreased, the surface of the support is prepared by blasting it with a jet of abrasive grains. These grains may be of various kinds: corundum (fused white alumina) grains, brown corundum grains, alumina-zirconia abrasive grains, abrasive grains produced from fuse-cast slag particles (of the Vasilgrit type), almandine garnet grains or else angular steel or cast iron shot (this list not being exhaustive).

Preferably, the following abrasives are used: corundum (fused white alumina), and alumina-zirconia (for example AZ24 from Saint-Gobain Coating Solutions) (this material is preferred for its high toughness that limits fracturing of the grains and consequently the inclusion of grain fractions in the surface—such inclusions are deleterious to adhesion of the coating). The average diameter of the abrasive grains is preferably between 180 and 800 µm, depending on the type of abrasive. The purpose of this operation is to give the surface roughness capable of ensuring correct adhesion of the tie sublayer or of the constituent material of the target.

An alternative method consists in machining striations that will also allow good adhesion of the sublayer and then of the functional film or the constituent material of the target.

Production of a Tie Sublayer by Thermal Spraying

To optimize the mechanical adhesion of the functional layer of the target, a tie sublayer may be produced by thermal spraying. This operation may employ conventional thermal spraying processes taken from the following: plasma powder spraying, electric-arc wire spraying, oxy-gas flame spraying (wire or powder depending on the equipment), spraying using the HVOF (high-velocity oxy-fuel) process, the detonation gun spraying process and the cold spray process using an optionally preheated gas into which powder is injected. This operation may be carried out in the ambient air without this impairing the invention.

The tie sublayer material may be chosen from the conventional materials used commonly as sublayers:
- nickel or nickel-based alloys: NiAl, NiCr or NiCrAl; iron or ferrous alloys: FeCrAl, FeCrC or FeMnC steels, X2CrNi18-9 or X2CrNiMo17-12-2 austenitic stainless steels, etc.;
- copper or copper alloys, such as CuAl, CuAlFe, CuZn, etc.;
- molybdenum or molybdenum alloys: MoCu, etc.

The above list is not exhaustive, the choice of sublayer material possibly depending on the material of the support tube and on the spraying equipment (and on the availability of filler material in suitable form).

Formation of the Functional Film of the Target According to the Invention, Preferably by Plasma Spraying The functional film of the target is formed by thermal spraying, preferably by plasma spraying, under the following particular conditions for 1 and 2:
- plasma spraying carried out in a chamber having a controlled atmosphere, that is to say for example one in which the oxygen and nitrogen content is low, the atmosphere consisting predominantly of inert gas, and the pressure in the chamber being between 50 mbar and 1100 mbar;
- plasma spraying using an inert or relatively reducing plasma gas mixture, making it possible to lower the amount of oxygen initially present on the surface of the powder particles upon melting them and during their flight onto the substrate, this being the case for example when the compound is a refractory material or when the compound is a resistive oxide;

use of nozzles for blowing powerful liquid or gaseous cryogenic jets of an inert fluid (in the case of refractory metals or resistive oxides) or of an inert or oxidizing fluid (in the case of volatile oxides), the jets being distributed around the torch;

relative movements between torch and target, allowing possible variation of the thicknesses formed on the target, especially additional thickness at the ends of the target, forming what is commonly referred to as a "dog-bone" target;

use of one or more powder injectors, allowing better distribution of the powder within the plasma jet; and it being possible for the plasma torch to be:
either a commercially available DC blown-arc plasma torch;
or an inductively coupled RF plasma torch.

The powder used to produce the target has the following typical characteristics:

defined particle size distribution such that:
$D_{10\%}$ (diameter such that 10% of the particles are smaller in size than this diameter): between 5 and 50 µm,
$D_{50\%}$ (median diameter): between 25 and 100 µm and
$D_{90\%}$ (diameter such that 90% of the particles are smaller in size than this diameter): between 40 and 200 µm;

purity according to the purity objectives for the target, preferably greater than 99.5%; and oxygen content: <1500 ppm, preferably <1000 ppm or even <500 ppm in the case of refractory metals.

Figure 1B:
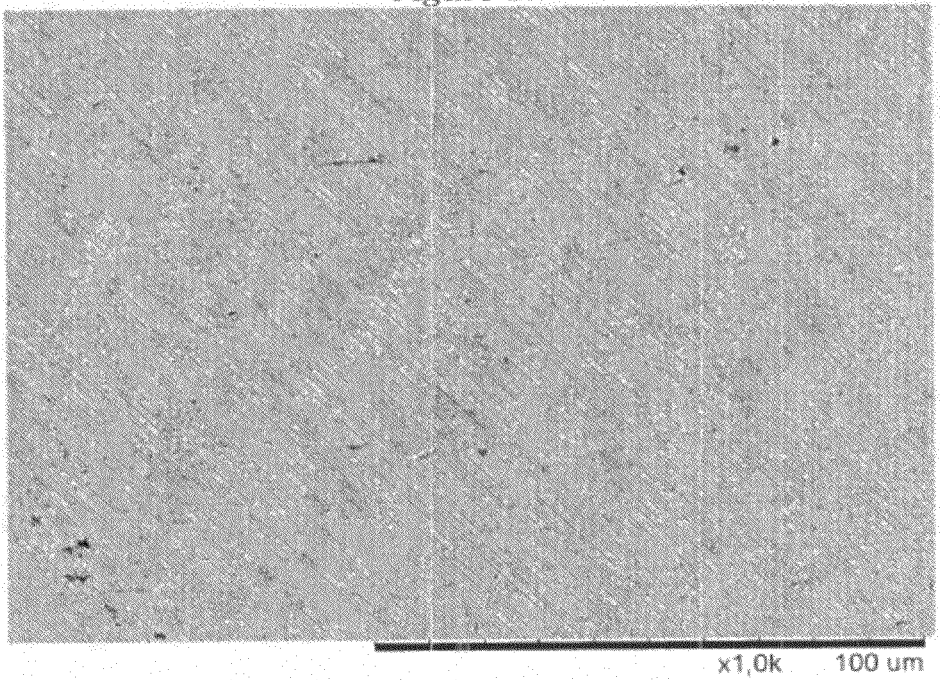
Figure 1C:
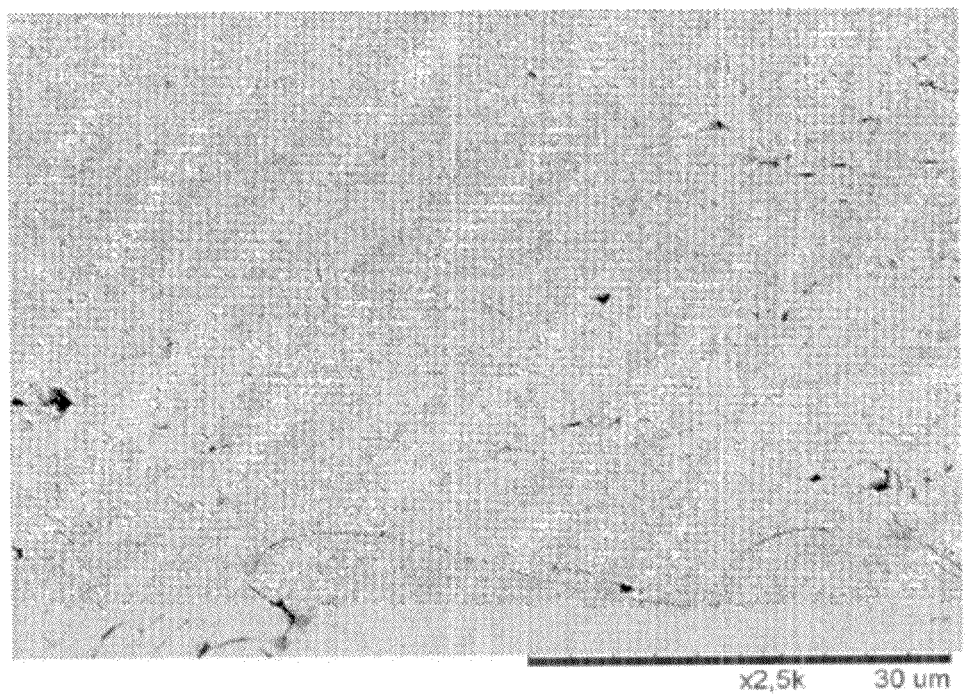
Figure 2:
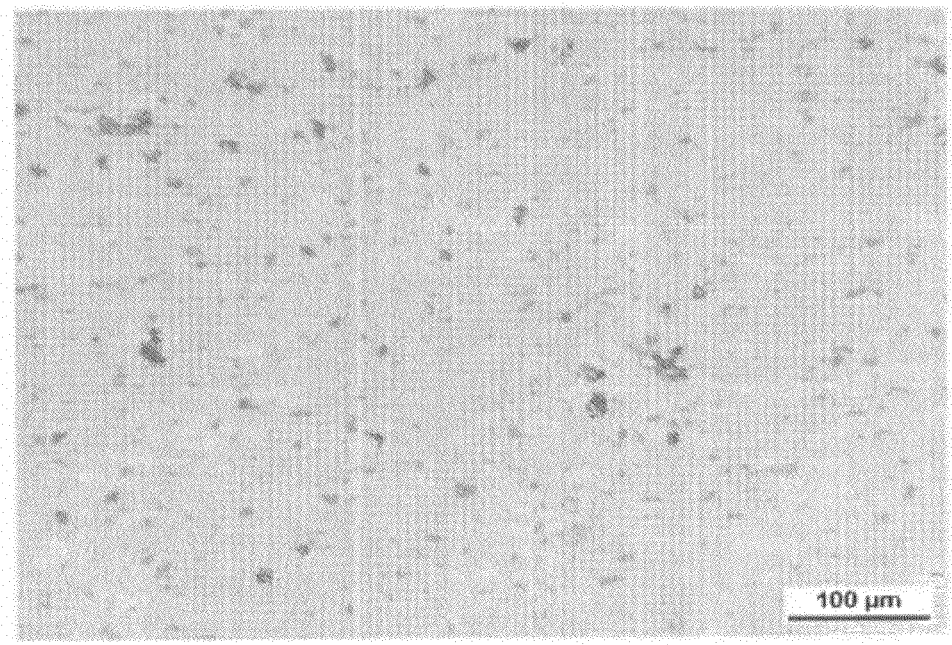
FIG. 2 is a view illustrating the microstructure in cross section of a barium titanate (resistive oxide) target obtained by the production process according to the invention.
Figure 3:
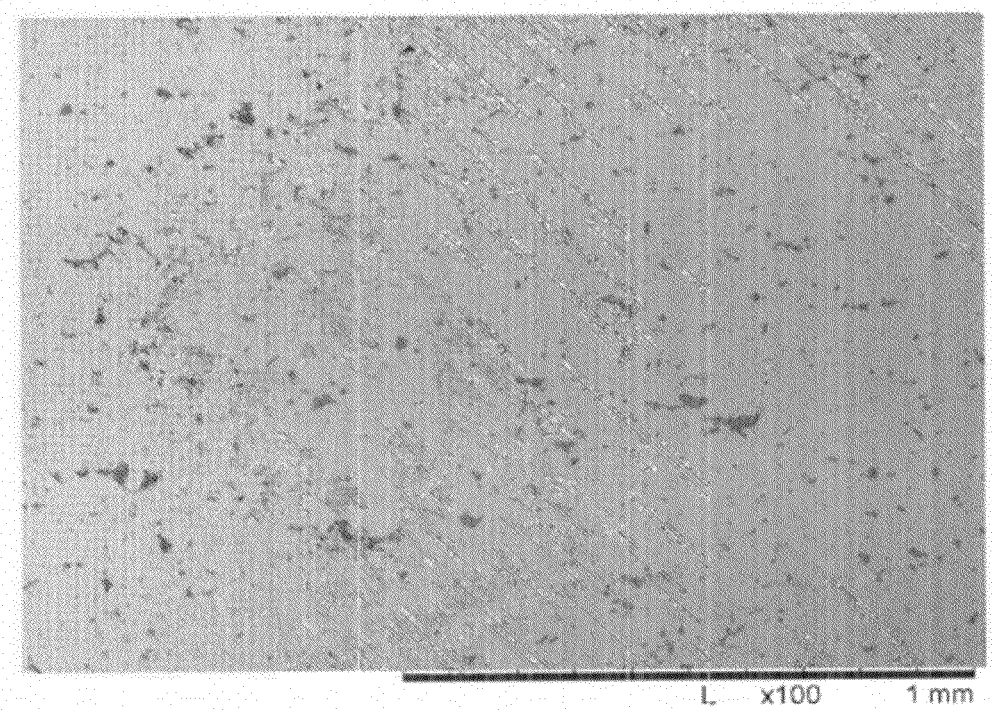
FIG. 3 is a view illustrating the microstructure in cross section of a mixed aluminum zinc oxide (volatile oxide) target obtained by the production process according to the invention.

The process according to the invention makes it possible to obtain a target quality superior to that conventionally obtained by spraying and having a lamellar microstructure: the reader may refer to FIGS. 1a, 1b and 1c in the case of molybdenum; to FIGS. 1d and 1e in the case of tungsten; to FIG. 2 in the case of resistive oxide; and to FIG. 3 in the case of volatile oxide, and to obtain a refractory metal target having an oxygen content of less than 500 ppm directly, without a subsequent step such as a high-temperature heat treatment in a reducing atmosphere.

The fact of not using a subsequent heat treatment step has the advantage of employing any type of material for the support (tube for a tubular target or flat support for planar targets), including supports having an expansion coefficient markedly different from that of the constituent material of the target (refractory metal or resistive oxide), such as austenitic stainless steels, which would be proscribed in the case of a subsequent heat treatment for reducing the oxygen content.

Of course, a heat treatment may also be carried out, as an option, so as to further reduce the oxygen content in the target thus produced.

Planar Target Case:

The present invention makes it possible to produce planar targets according to the following procedure:
planar target support, suitable for being fitted into the magnetron for use;
if the target support has a complex shape and has to be recycled after the target has been used, the target material will not be formed directly on the target support but on one or more intermediate plates (called "tiles") which will be bonded onto the support;
the target material (for example based on molybdenum) will be formed on the support or on the tile(s) following the same procedure as above; and
the bonding of the tile(s) may be carried out before formation of the target material (if the support has a high mechanical strength) or after formation of the target material on the tiles in the case in which the support is not strong enough. In the latter case, the dimensions of the tiles will be determined so as to minimize the risk of them being distorted during the operation of forming the target material by plasma spraying.

Implementation Example

This implementation example 1 (FIGS. 1a, 1b and 1c) relates to a tubular target based on a refractory metal, especially based on molybdenum, intended to be used in magnetron sputtering with a rotating cathode. The following process was carried out:

support tube made of austenitic stainless steel such as, for example, X2CrNi18-9 or X2CrNiMo17-12-2;

surface preparation of the support tube by AZ grit 24 alumina-zirconia abrasive blasting;

production of the keying sublayer by twin-arc wire spraying, carried out in air, the keying sublayer having an NiAl (95% nickel/5% aluminum) composition. In the example described, the thickness of the keying sublayer was a nominal 200 µm;

formation of the molybdenum active film on the target by plasma spraying under the following conditions:
plasma torch imparting particular plasma jet velocity characteristics and consequently sprayed particle characteristics,
target placed in a chamber,
creation of an inert atmosphere in the chamber, for example by pumping and then filling,
use of cryogenic cooling jets directed onto the target, these being distributed around the torch,
the powder used for producing the target was a molybdenum powder having the following characteristics:
agglomerated-sintered molybdenum powder
particle size $d_{50}$=80 µm
99.95% purity, with in particular 20 ppm of Fe and 600 ppm of oxygen and
plasma spraying with the following parameters:
a plasma torch with the following parameters was used to produce the target of the example:

| Parameters | Ar flow rate (slpm) | $H_2$ flow rate (slpm) | Arc current (A) | Spraying distance (mm) | Powder flow rate (g/min) |
|---|---|---|---|---|---|
| Values used | 50 | 15 | 600 | 160 | 160 | surface finishing by polishing or machining so as to obtain a roughness such that $R_{max}$<15 µm.

As indicated above, thanks to the specific process according to the present invention, the oxygen content in the target obtained was 450 ppm, less than the 600 ppm content initially present in the powder.

Additional results according to this protocol for producing a molybdenum target with different powder compositions, in comparison with a result without a cryogenic jet according to the invention, are given in the table below:

| Trial reference | Process | Oxygen content in the powder | Nitrogen content in the powder | Oxygen content in the target | Nitrogen content in the target |
|---|---|---|---|---|---|
| A | According to the invention | 657 | 18 | 340 | 20 |
| B | According to the invention | 657 | 18 | 240 | 20 |
| C | According to the invention | 922 | 26 | 340 | 23 |
| D | According to the invention | 526 | 29 | 360 | 18 |
| E | According to the invention | 526 | 29 | 360 | 19 |
| F | According to the invention | 706 | 31 | 580 | 30 |
| G | No cooling jets | 560 | 29 | 960 | 83 |

As the above results show, the plasma spraying process with cryogenic cooling jets distributed around the plasma torch makes it possible to reduce the oxygen content in the target compared with the oxygen content in the starting powder. It is thus unnecessary to choose a very pure starting powder, especially since it is not possible in practice to avoid the powder containing a certain amount of oxygen. The process according to the invention is thus particularly advantageous.

Implementation example 2 of a target based on a refractory compound is given below. Here, this is tungsten (refer to FIGS. 1d and 1e).

The implementation example relates to a planar tungsten target intended to be used in DC magnetron sputtering.

The following process was carried out:
construction of the target on an intermediate copper support plate intended subsequently to be brazed onto the target support;
surface preparation of the support plate by AZ grit 36 alumina-zirconia abrasive blasting;
production of the keying sublayer by plasma spraying of a CuAl (90/10) alloy, the sublayer having a thickness of 150 µm;
formation of the tungsten active film on the target by plasma spraying under the following conditions:
plasma torch imparting particular plasma jet velocity characteristics and consequently sprayed particle characteristics,
target placed in a chamber,
pumping cycle (down to a vacuum of $5 \cdot 10^{-2}$ kPa) followed by filling of the chamber with argon (up to 1 atm) so as to obtain an inert atmosphere (composed of argon with an oxygen partial pressure<$10^{-2}$ kPa) in the chamber,
use of cryogenic cooling jets directed onto the target, these being distributed around the torch,
the powder used for producing the target was a tungsten powder having the following characteristics:
particle size $d_{50}$=25 µm
99.95% purity,
plasma spraying carried out with the following parameters:
a plasma torch with the following parameters was used to produce the target of the example:

| Parameters | Ar flow rate (slpm) | H$_2$ flow rate (slpm) | Arc current (A) | Spraying distance (mm) | Powder flow rate (g/min) |
|---|---|---|---|---|---|
| Values used | 60 | 14 | 550 | 130 | 120 | surface finishing by polishing or machining so as to obtain a roughness such that $R_{max}$<15 µm.
The target obtained had the following other noteworthy characteristics:
density=88%
electrical resistivity such that:

| | |
|---|---|
| Theoretical volume resistivity of tungsten at 20° C. | 5.5 µΩ · cm |
| Volume resistivity at 20° C. measured on the target by the ASTM F76 (Van der Pauw) method | 9.55 µΩ · cm |

Example 3

Implementation Example of a Magnetron Target Made of a Resistive Oxide (Refer to FIG. 2)

This implementation example relates to a planar target made of barium titanate BaTiO$_{3-x}$ intended to be used in DC magnetron sputtering.

The following process was carried out:
construction of the target on an intermediate copper support plate intended subsequently to be brazed onto the target support;
surface preparation of the support plate by AZ grit 36 alumina-zirconia abrasive blasting;
production of the keying sublayer by plasma spraying of a CuAl (90/10) alloy, the sublayer having a thickness of 150 µm;
formation of the BaTiO$_{3-x}$ active film on the target by plasma spraying under the following conditions:
plasma torch imparting particular plasma jet velocity characteristics and consequently sprayed particle characteristics,
target placed in a chamber,
pumping cycle (down to a vacuum of $5 \cdot 10^{-2}$ kPa) followed by filling of the chamber with argon (up to 1 atm) so as to obtain an inert atmosphere (composed of argon with an oxygen partial pressure<$10^{-2}$ kPa) in the chamber,
use of cryogenic cooling jets directed onto the target, these being distributed around the torch,
the powder used for producing the target was a barium titanate having the following characteristics:
agglomerated-sintered powder
particle size $d_{50}$=70 µm
99.5% purity, (SrO impurity excluded)
plasma spraying carried out with the following parameters:
a plasma torch with the following parameters was used to produce the target of the example:

| Parameters | Ar flow rate (slpm) | H$_2$ flow rate (slpm) | Arc current (A) | Spraying distance (mm) | Powder flow rate (g/min) |
|---|---|---|---|---|---|
| Values used | 35 | 15 | 500 | 120 | 35 | surface finishing by polishing or machining so as to obtain a roughness such that $R_{max}$<15 μm.

Essential and Advantageous Characteristic of the Target Thus Produced:

| | |
|---|---|
| Theoretical volume resistivity of $BaTiO_3$ | $10^9$ Ω·cm |
| Volume resistivity measured on the target at 20° C. | 4.5 kΩ·cm |

The process according to the invention makes it possible for the resistivity of the material of the target to be very greatly reduced by creating oxygen vacancies.

Therefore, the target according to the example can be used in DC magnetron mode and makes it possible to produce stoichiometric $BaTiO_3$ films by using a moderate partial pressure in magnetron mode (not producing the same drawbacks as in reactive magnetron sputtering with a high partial pressure, for example $pO_2$ hysteresis phenomena).

Example 4

Implementation Example of a Magnetron Target Made of a Volatile Oxide (Refer to FIG. 3)

This implementation example relates to a tubular target intended to be used in rotary cathode magnetron sputtering. The following process was carried out:
- support tube made of austenitic stainless steel such as, for example, X2CrNi18-9 or X2CrNiMo17-12-2;
- surface preparation of the support tube by AZ grit 24 alumina-zirconia abrasive blasting;
- production of the keying sublayer by plasma spraying, carried out in air, the keying sublayer having an NiAl (80% nickel/20% aluminum) composition. In the example described, the thickness of the keying sublayer was a nominal 150 μm;
- formation of the AZO (2% $Al_2O_3$—ZnO) active film on the target by plasma spraying under the following conditions:
  - plasma torch imparting particular plasma jet velocity characteristics and consequently sprayed particle characteristics,
  - target placed in a chamber,
  - use of cooling jets,
  - the powder used for producing the target was an AZO powder having the following characteristics:
    - particle size $d_{50}$=50 μm
    - 99.9% purity,
  - plasma spraying carried out with the following parameters:
    - a plasma torch with the following parameters was used to produce the target of the example:

| Parameters | Ar flow rate (slpm) | $H_2$ flow rate (slpm) | Arc current (A) | Spraying distance (mm) | Powder flow rate (g/min) |
|---|---|---|---|---|---|
| Values used | 45 | 15 | 700 | 70-110 | 45 | surface finishing by polishing or machining so as to obtain a roughness such that $R_{max}$<15 μm.

The process according to the invention makes it possible to produce a monolithic crack-free AZO target with a thickness of 6 mm and with no joins between segments.

The target obtained had a density of 92% (5.15 g/cm³ for a theoretical AZO density of 5.57 g/cm³).

Properties and Advantages of the Invention

The targets according to the present invention have the following properties and advantages:
- better utilization factor of the material used in tubular targets obtained by plasma spraying compared with those obtained by the sintering (and/or hot-forming) processes because the process according to the present invention offers the possibility of depositing additional thickness at the ends of the targets so as to compensate for the extensive localized erosion in the zones corresponding to the bending, with a small radius of curvature, of the magnetic field created by the cathodes and their magnets. This makes it possible to achieve target material yields greater than 75%, or even 80%, whereas the yields remain below 75% in flat-profile targets. As a corollary to using this type of target, films, especially pure-molybdenum-based films, are obtained whose $R_\square$ uniformity profile, along a characteristic dimension of the substrate at the surface of which the film was deposited, deviates by no more than ±2% (for example on a substrate of 3.20 m width). This measurement is carried out using an apparatus of the "Nagy" type by contactless measurement;
- wide material thickness range on the target between 1 and 25 mm: the thickness of the target may be chosen according to the desired lifetime thereof (this thickness being in fact determined by the expected duration of production without stopping the line);
- in the case of tubular targets, it is possible to bias the target in AC mode or DC mode with power levels in excess of 30 kW/m (increase in deposition rate), without the risk of cracking (due to the thermal gradient between the support tube and the target) or the risk of braze melting; and
- because the material thickness is reduced to the amount strictly necessary for the user, it is possible to limit the voltage needed to sustain the high-power discharge and thus make this target compatible with current magnetron power supplies.

In the case of resistive-oxide targets according to the invention, the advantages are the following:
- possibility of producing ceramic targets for obtaining resistive thin films by nonreactive magnetron sputtering, requiring the use of a moderate oxygen partial pressure (no hysteresis effect in use). The ceramic targets obtained by the process according to the invention have a greatly reduced resistivity relative to the theoretical resistivity of the compound;
- possibility of producing large monolithic cylindrical targets;
- possibility of producing targets with local extra thickness at the ends ("dog-bone" targets); and
- excellent bonding to the support tube with no meltable intermediate phase.

In the case of volatile-oxide targets according to the invention, these offer the following advantages:
- material yield losses are minimized and the process is viable for this type of composition; and
- the internal stresses in the targets produced by the process in question are reduced, without it being necessary to increase the porosity. This makes it possible to construct targets having greater thicknesses than in the prior art by plasma spraying (for example 6 mm in the case of AZO).

In the case of monolithic tubular or planar targets produced using the present invention, and in contrast with targets comprising assembled segments, the following risks are considerably reduced:

risk of appearance of arcing, which generates parasitic particles, and the risk of fragments of the target material being separated from its support, which is known to be a source of contamination of molybdenum films;

risk of sputtering braze material or target support material via the gaps between segments; and risk of thermal or mechanical failure of the bonding (braze or conductive cement) to the support.

The invention claimed is:

1. A process comprising:
(A) thermal spraying at least one compound onto at least one surface portion of a target support with a plasma torch, thereby forming a target on the target support,
wherein the target comprises the compound,
wherein the compound is at least one selected from the group consisting of a refractory metal, a resistive oxide and a volatile oxide,
wherein at least one fraction of the compound is a powder composition, and
wherein the thermal spraying is performed in a controlled atmosphere; and
(B) directing powerful cryogenic cooling jets onto the target during the thermal spraying in (A),
wherein the cryogenic cooling jets are distributed around the torch.

2. The process of claim 1, further comprising:
purging or rinsing a chamber and filling the chamber with inert gas, at a pressure of from 50 mbar to 1100 mbar, thereby creating an oxygen-depleted atmosphere in the chamber; and
spraying the at least one compound into the chamber.

3. The process of claim 1, wherein the thermal spraying with the plasma torch is performed with a plasma gas mixture,
wherein the plasma gas reduces a content of oxidized compound initially present in the powder.

4. The process of claim 1, wherein all or some of the cryogenic cooling jets provide oxidation.

5. The process of claim 1, further comprising,
depositing a keying sublayer before the at least one compound is thermally sprayed on the at least one surface portion of the target support.

6. The process of claim 1, further comprising,
thermally regulating the target during the thermal spraying.

7. The process of claim 1, wherein the powder composition of the at least one compound comprises powder particles with a size distribution of $5 < D_{10} < 50$ μm; $25$ μm $< D_{50} < 100$ μm; and $40$ μm $< D_{90} < 200$ μm.

8. The process of claim 1, further comprising,
after the thermal spraying, heat treating the target in a reducing atmosphere, thereby reducing an oxygen content present in the target.

9. The process of claim 1, wherein several compound injectors are employed for injecting, at different points in a thermal jet of the thermal spraying, different materials, for which injection parameters are adjusted independently according to materials injected into each injector.

10. A target produced by the process of claim 1, wherein the target comprises predominantly at least one compound selected from the group consisting of a refractory metal, a resistive oxide and a volatile oxide, and
has a lamellar microstructure.

11. The target of claim 10, wherein the target comprises the refractory metal and the target has an electrical resistivity less than five times a theoretical electrical resistivity of the refractory metal.

12. The target of claim 10, wherein the target comprises at least one resistive oxide and has a target volume resistivity lower than a nominal resistivity of the resistive oxide by a factor of 1000.

13. The target of claim 10, wherein the target comprises a at least one volatile oxide and has a nominal thickness greater than 3 mm.

14. The target of claim 13, wherein the target has a density greater than 85% of a nominal density.

15. The target of claim 10, wherein the target comprises a refractory metal which is selected from the group consisting of molybdenum, tungsten, tantalum, niobium, titanium, vanadium, hafnium, zirconium, rhenium, rhodium and a refractory alloy
wherein the alloy is
an AB alloy wherein A and B are Mo, W, Ta, Nb, Ti, V, Hf, Zr, Re, or Rh,
or
an AM alloy wherein A is Mo, W, Ta, Nb, Ti, V, Hf, Zr, or Re, and M is Co, Cr, Ni, Rh, Pd, Pt, Cu, Ag, or Au.

16. The target of claim 15, wherein the target comprises a refractory metal and silicon in molar proportions from 1 mole of the refractory metal per 5 moles of silicon up to 5 moles of the refractory metal per 1 mole of silicon.

17. The target of claim 16, wherein the lamellar microstructure is a composite and comprises a refractory metal lamellae juxtaposed with a pure silicon lamellae.

18. The target of claim 10, wherein the target comprises, the at least one resistive oxide, and the resistive oxide is
at least one oxide having a perovskite structure of formula $ABO_3$ in which A and B are at least one element or combination of elements such that a sum of valencies of the at least one element constituting A and of a valency of the at least one element constituting B is equal to 6, or
at least one oxide having a columbite/trirutile $AB_2O_6$ structure wherein B is Nb or Ta and A is an element of valency 2, or
at least one selected from the group consisting of $Ta_2O_5$, $Nb_2O_5$, $V_2O_5$, $ZrO_2$, $HfO_2$, $CeO_2$, $Y_2O_3$, $Al_2O_3$, $La_2O_3$, MgO, and BeO.

19. The target of claim 18, wherein the target comprises a composition of two or more resistive oxides.

20. The target of claim 10, wherein the target comprises, at least one volatile oxide satisfying a criterion: $T_{vap} < T_m + 400°$ C.,
wherein the at least one volatile oxide is selected from the group consisting of zinc oxide, tin oxide, barium oxide, cadmium oxide, indium oxide, molybdenum oxide, zinc oxide doped with aluminum, molybdenum, gallium, tin, fluorine, indium, and a mixed indium tin oxide.

21. The target of claim 20, wherein the target comprises a composition of two volatile oxides,
or comprises predominantly one volatile oxide.

22. A process for producing a film, the process comprising:
sputtering a target, wherein the target is obtained by the process of claim 1.

* * * * *